United States Patent
Kannan et al.

(10) Patent No.: US 10,170,373 B2
(45) Date of Patent: Jan. 1, 2019

(54) METHODS FOR MAKING ROBUST REPLACEMENT METAL GATES AND MULTI-THRESHOLD DEVICES IN A SOFT MASK INTEGRATION SCHEME

(71) Applicant: GLOBALFOUNDRIES INC., Grand Cayman (KY)

(72) Inventors: Balaji Kannan, Fishkill, NY (US); Rekha Rajaram, Hopewell Junction, NY (US); Unoh Kwon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 375 days.

(21) Appl. No.: 14/495,170

(22) Filed: Sep. 24, 2014

(65) Prior Publication Data

US 2016/0086860 A1    Mar. 24, 2016

(51) Int. Cl.
  *H01L 21/8238* (2006.01)

(52) U.S. Cl.
  CPC .......................... *H01L 21/823842* (2013.01)

(58) Field of Classification Search
  CPC combination set(s) only.
  See application file for complete search history.

(56) References Cited

U.S. PATENT DOCUMENTS

| | | | |
|---|---|---|---|
| 7,838,908 B2 | 11/2010 | Kwon et al. | |
| 8,309,419 B2 | 11/2012 | Schaeffer et al. | |
| 8,378,498 B2 | 2/2013 | Blackshear | |
| 8,420,473 B2 | 4/2013 | Ando et al. | |
| 8,445,344 B2 | 5/2013 | Carter et al. | |
| 8,450,946 B1 | 5/2013 | Lunn et al. | |
| 8,581,351 B2 | 11/2013 | Ando et al. | |
| 2012/0061772 A1 | 3/2012 | Guo et al. | |
| 2012/0280288 A1 | 11/2012 | Ando et al. | |
| 2013/0020658 A1* | 1/2013 | Guo | H01L 29/4958 257/412 |
| 2013/0049123 A1 | 2/2013 | Baars et al. | |
| 2013/0082332 A1 | 4/2013 | Liu et al. | |
| 2013/0161764 A1 | 6/2013 | Wong et al. | |
| 2013/0187236 A1 | 7/2013 | Xie et al. | |
| 2013/0203231 A1* | 8/2013 | Fitzsimmons | H01L 21/823842 438/299 |
| 2013/0256802 A1 | 10/2013 | Jagannathan et al. | |
| 2013/0256803 A1* | 10/2013 | Clark | H01L 21/823842 257/368 |
| 2014/0131808 A1 | 5/2014 | Ando et al. | |
| 2014/0246729 A1* | 9/2014 | Jang | H01L 27/092 257/377 |

\* cited by examiner

*Primary Examiner* — Lex Malsawma
(74) *Attorney, Agent, or Firm* — Yuanmin Cai; Hoffman Warnick LLC

(57) ABSTRACT

A method of fabricating advanced multi-threshold field effect transistors using a replacement metal gate process. A first method includes thinning layers composed of multilayer film stacks and incorporating a portion of the remaining thinned film in some transistors. A second method includes patterning dopant materials for a high-k dielectric by using thinning layers composed of multilayer thin film stacks, or in other embodiments, by a single thinning layer.

20 Claims, 11 Drawing Sheets

10 - Provide a substrate having a 1st set of FETs and a 2nd set of FETs and a dielectric layer having openings over a portion of both regions 20 - Form a high-k layer in the openings in the openings 25 – Form a multi-layered stack in the openings.

30 – Lithographically pattern the substrate, leaving the stack in the second FET region and removing the stack in the first FET region to expose the high-k layer. (First lithography)

40 - Thin the stack left in the second FET to form a remaining stack

42 - Form doping stack over both regions of the substrate

46 – Mask and remove doping stack from second set of FETs (Second Lithography)

47 – Remove Mask

55 – Form annealing stack and anneal to dope high-k of first set of FETs

62 - Remove all remaining layers to reveal high-k in both sets of FETs

70 – work function metals in NFETs of 1st and 2nd sets of FET;
  - work function metals in PFETs of 1st and 2nd sets of FETs.

90 - Fill the openings

1st set of FETs doped - 2nd set of FETs undoped – each set having an opposite type FET

Fig. 9

METHODS FOR MAKING ROBUST REPLACEMENT METAL GATES AND MULTI-THRESHOLD DEVICES IN A SOFT MASK INTEGRATION SCHEME

BACKGROUND OF THE INVENTION

The subject matter of the present application relates to semiconductor devices of integrated circuits and their fabrication, particularly field effect transistors.

One of the ways proposed to improve performance in complementary metal oxide semiconductor ("CMOS") technology integrated circuits is to provide a high dielectric constant, i.e., "high-k" gate dielectric layer, for n-type and p-type field effect transistors ("NFET" and "PFET" devices), and to form metal gates of the NFET and PFET devices.

However, differences in the workfunctions of NFET and PFET devices typically require different metal layers to be provided in the gates of respective N- or P-type transistors. In addition, making the same type of FET (meaning both N or both P) having different threshold voltages is desirable. Heretofore, methods for forming the gates of N- and P-type transistors have been cumbersome. Further improvements in the fabrication of N- and P-type transistors having metal gates are needed as well as further improvements in the fabrication of multi-threshold transistors having metal gates.

BRIEF DESCRIPTION OF THE DRAWINGS

FIG. 9 is a flow chart of another embodiment of a method of forming a multi-threshold substrate in which one of the FETs incorporates a doped high-k.

SUMMARY OF THE INVENTION

Figure 1:
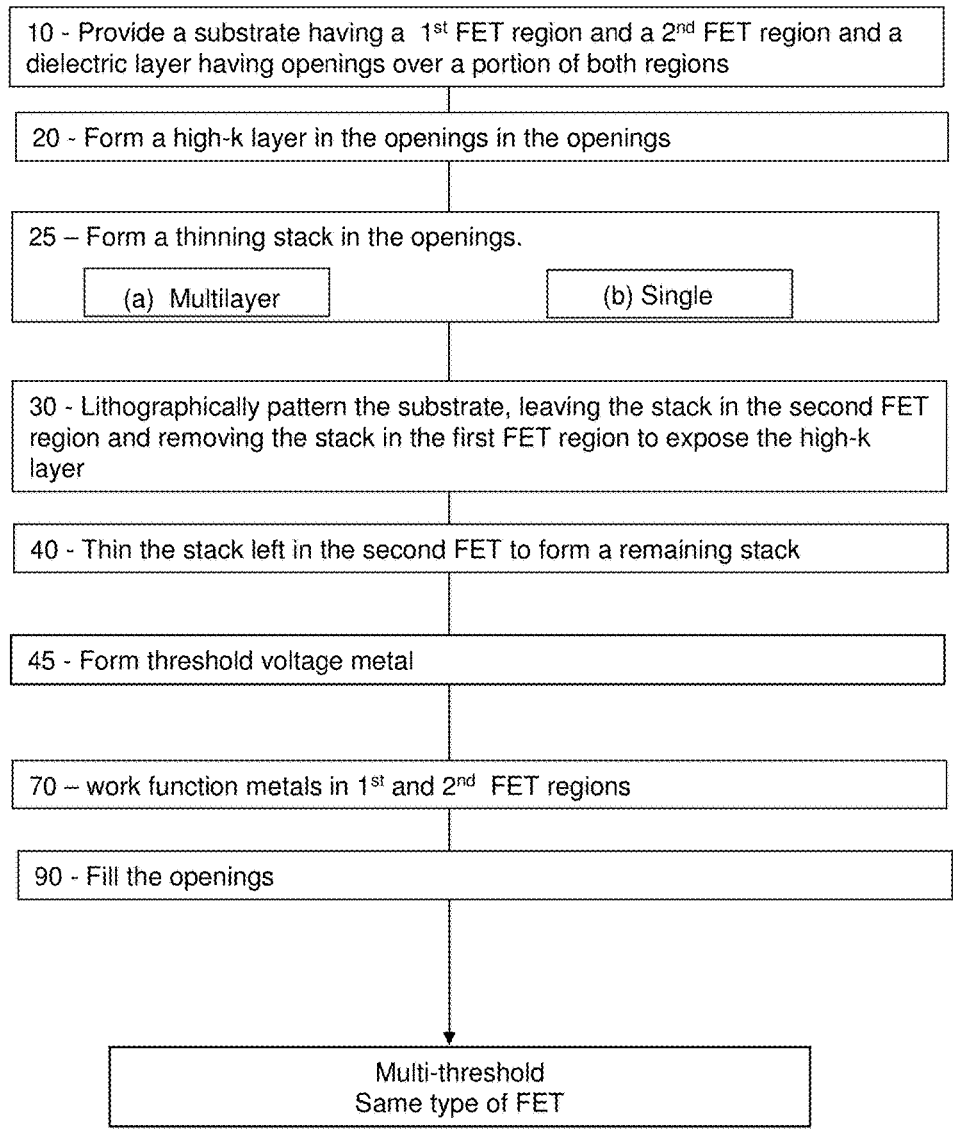
FIG. 1 is a flow chart of an embodiment of a method of forming a multi-threshold substrate in which one of the FETs incorporates a thinned layer.

The present invention thins multi-layered or single film stacks to form FETs having different threshold voltages. The invention advantageously uses selective etching of multi-layered stacks containing a sacrificial film or controlled etching of single film to form high-k replacement metal gate structures made using soft metal mask. The initially thick single film stack or initial multi-layered film stack allows the use of a soft metal mask without degradation of device properties of the transistors. In one embodiment, the subsequent thinning of the stack and incorporation of the remaining stack in an FET allows voltage threshold differences to be created among different types of FETs or the same type of FET. In another embodiment, the subsequent thinning of the stack allows one set of FETs' high-k to be doped while the other set of FETs remains undoped, thus making two sets of FETs with different voltage thresholds.

In one embodiment a thinning stack (either multi-layered or single layer) allows a replacement metal gate structures of the same FET type (for example, all N-FETs or all P-FETs) to have different threshold voltages. An integrated circuit which has the same type of FET having different threshold voltages will herein be referred to as a "multi-threshold" substrate. The method may use a multi-layered stack, which due to its multi-layers, may be initially thick and then later selectively thinned. Alternatively, a single layer stack may be used which is initially thin and can be controllable thinned. It is advantageous to have a thick layer when patterning using a soft mask. The patterning reveals the high-k material in a first FET and leaves the thinning stack over the second FET region. After the soft mask patterning, the thinning stack is thinned to leave a remaining portion of the stack over the second FET region. Then the same threshold voltage metal is formed over both FET regions along with the same work function metals and a fill material. While the two FETs share the same work function metal and threshold voltage metal, they have different threshold voltages because the second FET region also has the remaining thinning stack portion which functions to also modulate the threshold voltage of the second FET region. Therefore, the thinning of a thinning stack allows soft mask patterning without damaging the high-k layers and because a portion of the stack remains in place, multi-threshold devices are formed. Here, a difference in threshold voltage is achieved without doping the high-k material.

In another embodiment, a multi-layer thinning stack allows the high-k of a first set of FETs to be doped while the second set of FETs is undoped. Here, the first doped set of FETs may include P-FETs and N-FETs while the second undoped set of FETs may also FETs include P-FETs and N-FETs. In this manner, the first set (doped set) of FETs may include a low threshold voltage NFET and a high threshold voltage PFET, while second set (undoped set) of FETs may include a high threshold voltage NFET and a low threshold voltage PFET. Thus, here, a multi-threshold substrate is formed based on doping of the high-k rather than incorporation of a thinned layer as was done in the earlier embodiment. Specifically, a method of the second embodiment may use a multi-layered stack, which due to its multi-layers, may be initially thick and then later selectively thinned. Preferably, soft mask patterning is used to reveal the high-k material in a first set of FETs while the multi-layer stack remains over the second set of FETs. Then the multi-layered stack is thinned. Doping materials are formed over both sets of FETs. A mask is used to remove the doping material from the second set of FETs such that, in a subsequent anneal, only the first set of FETs receives the doping material in the high-k layer. Conventional lithography is then used to form n-work function metals in the NFETS of the first and second sets of FETs and p-work function metals in the PFETS of the first and second sets of FETs. A fill metal stack completes the gates.

DETAILED DESCRIPTION

Multi-Threshold by Thin, Remaining Film Incorporation Embodiment

FIG. 1 is a flow chart of an embodiment of making is making multi-threshold substrate by using a multi-layered or single layer stack in a soft mask replacement metal gate process. In step 10 a substrate having two FET regions is provided. Over the substrate is a dielectric layer having two openings, which preferably were made by removing a dummy gate. These openings will be over the FET regions of the substrate and depending high-k integration scheme, may expose the substrate ("high-k last" integration scheme), may expose an interfacial layer in contact with the substrate ("high-k last" integration scheme), or may expose a high-k dielectric previously formed over the substrate ("high-k first" integration scheme). These openings will contain the future high-k, metal gates of the FETs.

Still referring to FIG. 1, in step 20, a high-k layer is formed in the openings in a high-k last integration scheme. If a high-k first scheme is practiced, forming the high-k is skipped. Thus, in a high-k last embodiment, the high-k layer lines the sidewalls and the bottom of the openings whereas in a high-k first embodiment the high-k is only at the bottom of the opening because the high-k material was formed with the dummy gate.

In step 25, a stack is formed over the substrate and the high-k layer. In some cases, a multi-layer stack (a) is used that will advantageously allow a stack of different thicknesses to be formed and used during various steps in the process. Thus, as will explained later, the multi-layers allows the overall thickness of the stack to be tuned depending upon the needs of that particular step of the process. The multi-layer approach, as will be shown later, also allows a thin remaining stack to be formed at some steps; thin stacks, without use of the multi-layer stack of this invention, are often difficult to create. Alternatively, at step 25 in some case, a single layer (b), which is subsequently thinned, is formed rather than the multi-layered stack. Thus, the term "stack" as used here can be a single layer or a multi-layered film stack.

Referring to step 30 of FIG. 1, the stack is lithographically patterned so that it is removed from a first FET region but remains on a second FET region. As will be explained later, it is during lithographic patterning that it is important to have a thick stack.

Referring to step 40, a portion of the stack in the second FET region is removed (or thinned in the case of the single layer stack) to leave a remaining, thin stack.

At step 45, both the exposed high-k of the first FET region and the thinned remaining portion of stack are covered by a threshold voltage metal. After forming the threshold voltage metal, the flow chart moves to step 70 to forming the work function metals and then to step 90 of filling the openings. The result is a substrate having a pair of the same type of FET (for example both N-FET) with different threshold voltages, i.e. a multi-threshold substrate. In this embodiment, the threshold voltage difference is achieved by incorporating the remaining stack in some of the FETs. The method of FIG. 1 will now be described in more detail in conjunction with FIGS. 2-8.

Figure 2:
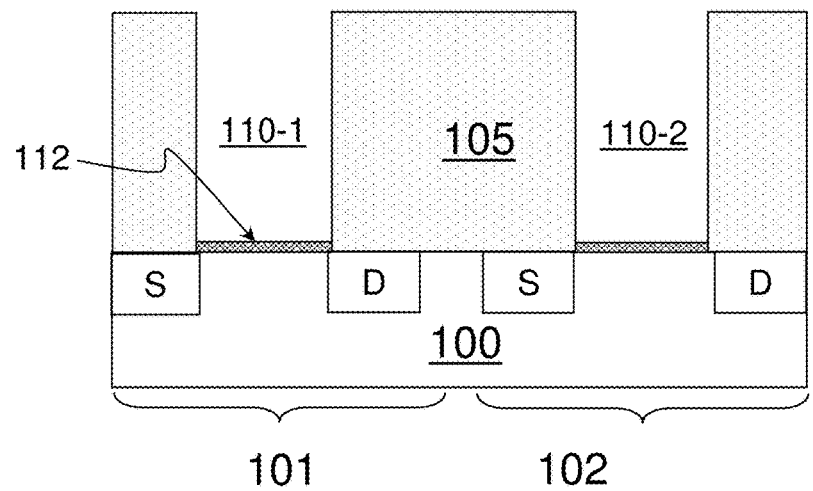
FIG. 2 is a sectional view illustrating a starting stage in forming a multi-threshold substrate in a replacement metal gate integration scheme according to an embodiment of the present invention.

FIG. 2 illustrates a structure which can represent a preliminary stage in the above described method, specifically, a cross-section of the substrate at the end of step 10. As illustrated in FIG. 1, is a semiconductor substrate 100 which may be a bulk single crystalline substrate a semiconductor on insulator substrate. The substrate 100 may be planar or have fins. The substrate has a first FET region 101 and second FET region 102. In some embodiments the first region 101 may be include active semiconductor region in which an n-type field effect transistor ("NFET") is to be formed, while in some embodiments the second region 102 may include a second active semiconductor region in which a p-type field effect transistor ("PFET") is to be formed. In other embodiments both regions contain the same type of FET (e.g. both NFET or both PFET). An isolation region may separate the first and second FET regions, but is omitted from the figures for simplicity purposes.

Continuing with FIG. 2, overlying the substrate 100 is dielectric layer 105. The dielectric layer may be a single composition or may include multitude of different dielectric materials and layers. In the dielectric layer are at least two openings over the first and second FET regions of the substrate. Here, in a version of a high-k last integration scheme, the openings reveal a previously formed interfacial layer 112. The interfacial layer may contain silicon and at least one of oxygen and nitrogen. In the substrate, on either side of the opening will be previously formed source (S) and drain (D) regions of the FETs. The source and drain regions may be, embedded in the substrate, raised from the substrate or both. The source and drain regions may or may not have silicide on them at this point in the process.

Figure 3:
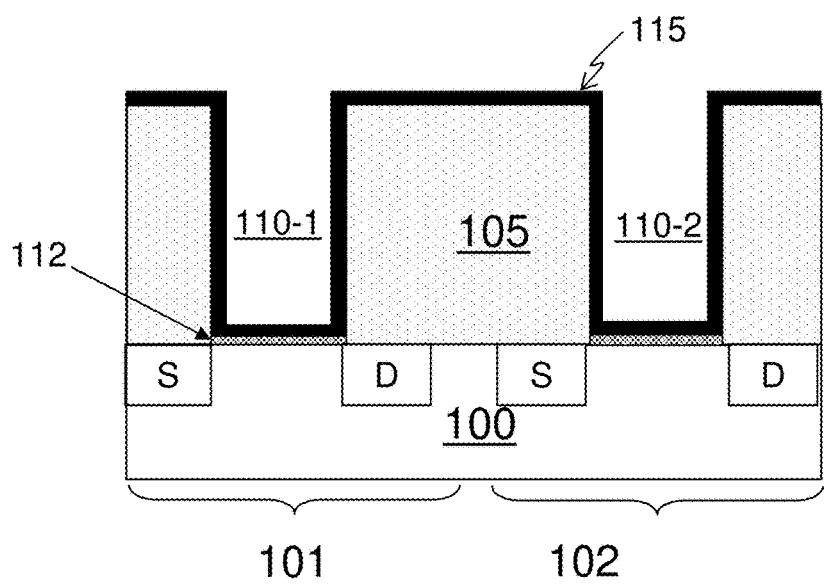
FIG. 3 is a sectional view illustrating forming a high dielectric constant (high-k) layer according to an embodiment of the present invention.

Thereafter, as shown in FIG. 3's high-k last embodiment, a high-k layer 115 can be formed overlying the interfacial layer 112 and in the first and second openings 110-1 and 110-2. Alternatively, interfacial layer 112 can be removed, and a new interfacial layer formed and/or high-k layer 115 can be formed in place of such layer. In one embodiment, the high-k layer 115 may include a high dielectric material having a dielectric constant greater than silicon dioxide and more preferably greater than silicon nitride. For example, the high-k layer 115 may include one or more of the following dielectric materials: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Typically, such layer may be deposited by chemical vapor deposition (CVD) or atomic layer deposition (ALD). The high-k layer 115 typically deposits onto all exposed surfaces, including lining the openings 110-1, 110-2 and overlying the first and second FET regions 101, 102, and onto the interfacial layer 112, when present within the gate openings.

Figure 4:
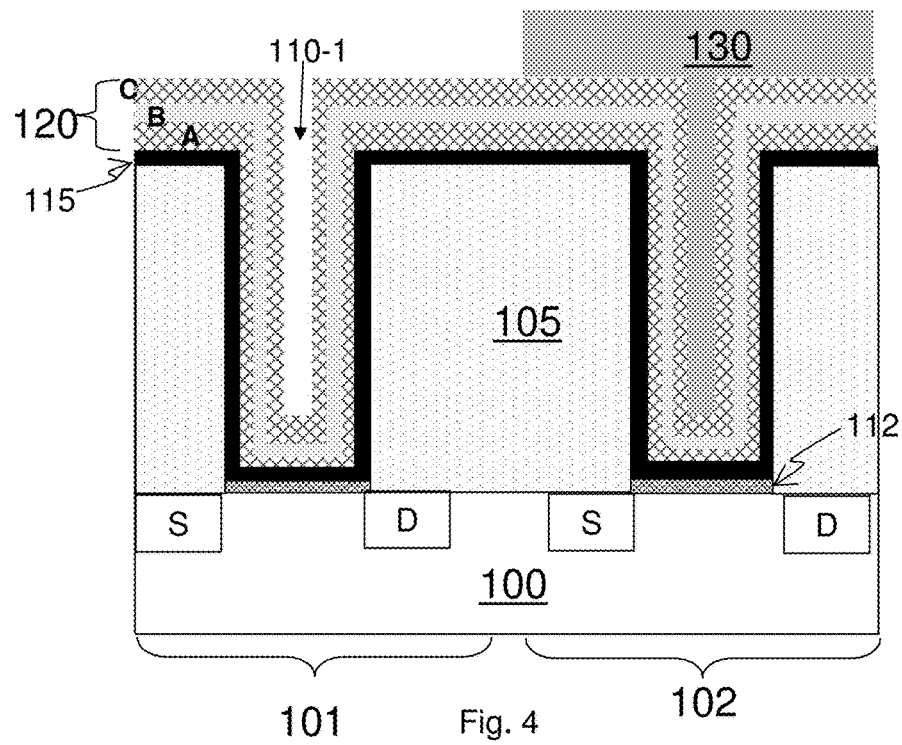
FIG. 4 is a sectional view illustrating a stage subsequent of forming a thinning stack according to an embodiment and a lithographic stack which has been patterned according to an embodiment of the present invention.

Subsequently, as illustrated in FIG. 4 in accordance with option (a) of step 20, a multi-layered stack 120 is formed over the substrate. The stack includes three layers a first bottom layer (A), a second middle layer (B), and a third top layer (C). In a preferred embodiment the first (bottom—A) and third (top—C) layers may be titanium nitride while the second (middle—C) layer is a lanthanum (La) containing material such as La or lanthanum oxide. The second middle layer 120B of the multi-layer stack 120 may also be TiAlC. In other embodiments the second middle layer 120B of the multi-layer stack 120 may be amorphous silicon. Generally, speaking the middle layer is a layer which can be removed selectively with respect to the bottom layer. As formed, the first (bottom—A) layer may be from about 15 angstroms to 25 angstroms and ranges there between; the second (middle—B) layer may be from about 5 angstroms to 15 angstroms and ranges there between; and the third (top—C) layer may be from about 5 angstroms to 30 angstroms and ranges there between.

Alternatively, in accordance with option (b) step 20, the stack 120 may be a single layer of titanium nitride which is thick enough to protect the substrate in the subsequent patterning steps. Preferably the single, thick stack is equal to or greater than about 25 angstroms.

Continuing with FIG. 4, a soft mask lithographic material 130 has been patterned over the substrate. Soft mask lithographic material may include one or more of the following: photoresist, an antireflective coating and an optical planarization layer (OPL) and preferably does not include a hard mask layer such as silicon dioxide or a metal hard mask. If the stack 120 were a single thin titanium nitride layer, the reactive ion etching process used to pattern the OPL would interact with the underlying high-k material causing an increase in the interfacial layer 112 thickness which, in turn, undesirably increases the Tinv (inverse of gate capacitance). To solve this problem, in option (a) a multi-layer stack of step 20 is used whereas in option (b) a single thick TiN stack is used. As will be seen later, in each embodiment the stack 120 later can be later thinned. This allows the stack 120 to be initially thick to protect the high-k 115 and interfacial layers 112 during patterning of the lithographic material and later thinned which is advantageously used in this embodiment to tailor work function in the second FET relative to the first FET.

Figure 5:
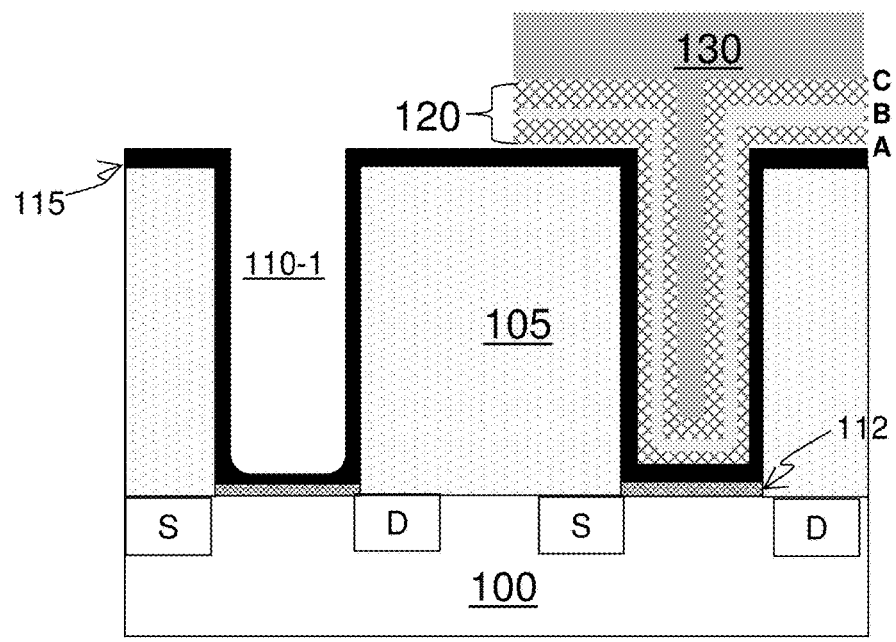
FIG. 5 is a sectional view illustrating a stage subsequent in which the thinning stack has been removed from a first FET region according to an embodiment of the present invention.

Continuing with FIG. 4 and transitioning to FIG. 5, after the lithographic patterning (shown in FIG. 4) the stack 120 is exposed in the first FET region 101, while the second region 102 is covered with lithographic material 130. While in this configuration, the stack 120 is removed from the first FET region 101 leaving the high-k layer 115 exposed in the first FET region 101 as depicted in FIG. 5.

Figure 6:
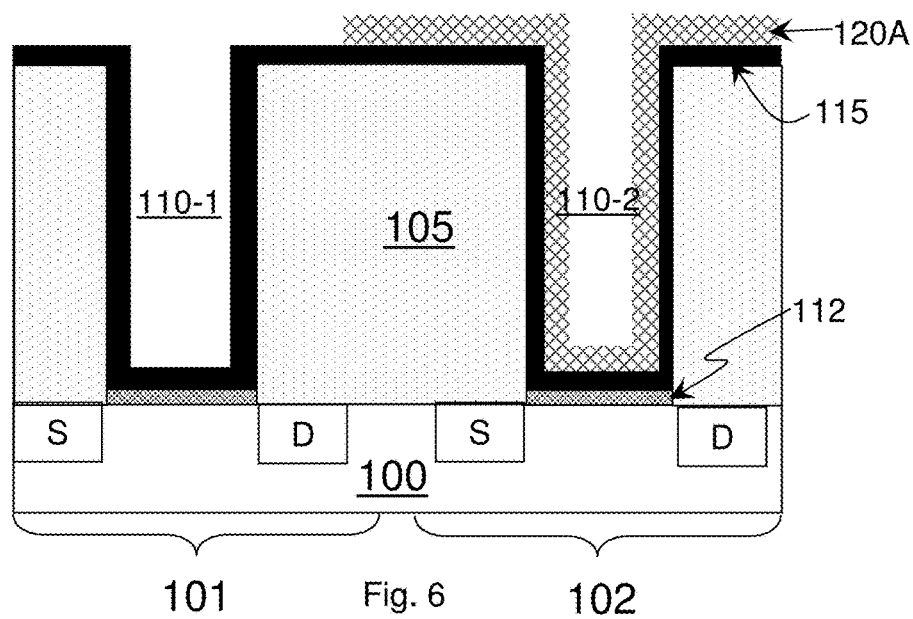
FIG. 6 is a sectional view illustrating a stage subsequent in which the thinning stack has a portion removed to leave a remaining portion over the second FET region according to an embodiment of the present invention.

Continuing with FIG. 5 and transitioning to FIG. 6, the lithographic material 130 is removed from the second FET region 102. Now, in accordance with option (a), the multi-layer stack 120 may be thinned by removing the top two layers, namely third (top) layer 120C (titanium nitride in a preferred embodiment) and second (middle) layer 120B (a lanthanum containing layer in a preferred embodiment), thereby leaving the first (bottom) layer 120A (titanium nitride, in a preferred embodiment) of the stack over the second FET region 102 of the substrate. The remaining first layer 120A may remain in the final structure, serving as one of the materials determining the work function of the FET. The thickness of the remaining layer may be from about 15 angstroms to about 25 angstroms and ranges there between.

The thinning of a multi-layer thinning 120 stack embodiment can occur because of the unexpected finding that the middle thinning layer 120B (preferably a La containing material) will etch readily in a hot peroxide solution when it is on silicon, but is etch resistant to the same chemistry when it is on titanium nitride (as in the preferred embodiment). By taking advantage of this unexpected phenomenon the multi-layer thinning stack is able to be both thick (when protecting the first FET region during OPL patterning) and thinned when functioning as a dopant barrier. Accordingly, a series of selective etches may be used to thin the thinning layer. For example, the top thinning layer 120C may be etched in peroxide while the middle thinning layer 120B is not etched (i.e. selective removal of the TiN relative to the middle layer sacrificial layer). Then the middle thinning layer 120B may be removed with chloride containing chemistry selectively with respect to the bottom thinning layer 120A to leave the thinned thinning layer 120A.

In the alternate embodiment in which a single thick titanium nitride layer is used, then during a subsequent anneal, the inventors have discovered that dissolved oxygen in the titanium nitride may undesirably enter the high-k layer of the undoped FET (FET with thinning material overlying it, here, the second FET). There are two possible solutions of the dissolved oxygen problem of the single thick thinning layer. One is to use a silicon dioxide hard mask to prevent oxygen from entering the TiN thinning film. However, the hard mask approach is undesirable because after patterning, HF is used to remove the hard mask. HF will attack the high-k 115 layer. Another solution is to thin the single thick thinning layer thus removing the upper portions of the layer which contain the oxygen. Unfortunately, it can be difficult to reliably and repeatedly thin a single, thick TiN layer to the thicknesses required. However, as practiced in embodiment B, the inventors have found a repeatable and controllable process (~5-10 Angstrom/min removal rate and ranges there between) to achieve such thinning. Specifically, a titanium nitride thinning film can be etched in a solution of room temperature or colder aqueous ammonia hydroxide and an aqueous hydrogen peroxide (SC1) having about a 50:1.5 ratio. Note that a remaining thinned layer will be referred to as 120A regardless if it is a remaining portion of a multi-layer stack or an initially thicker single layer thinning stack.

Figure 7:
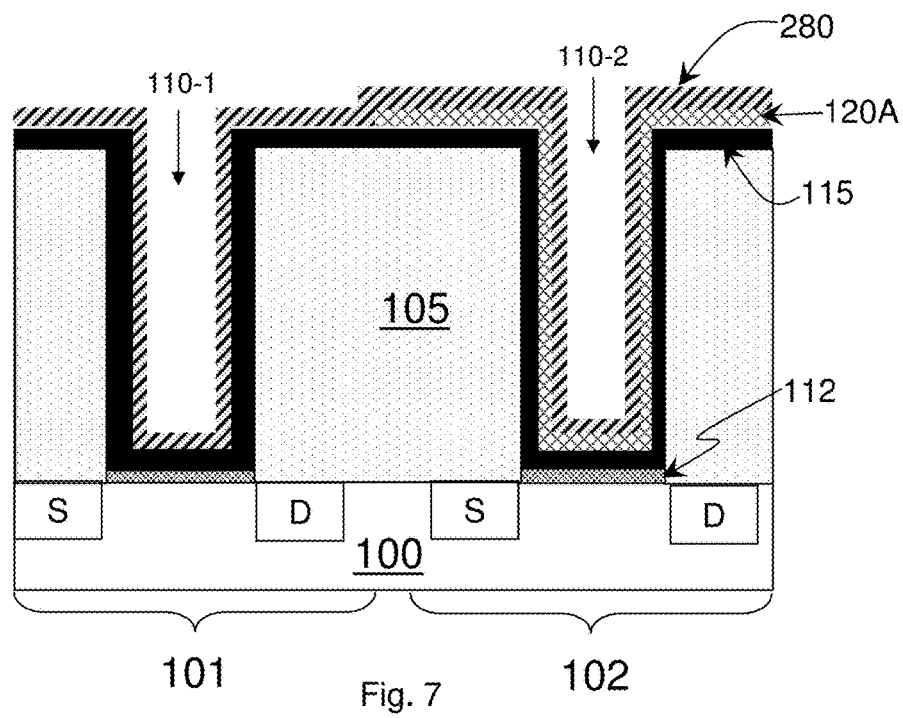
FIG. 7 is a sectional view illustrating a stage subsequent in which a threshold control material is placed over both FET regions according to an embodiment of the present invention.

Turning to FIG. 7, which corresponds to step 45 of the method, a threshold voltage metal 280 is formed in the first and second openings 110-1 and 110-2 respectively, over the first and second FET regions 101 and 102, respectively. Specifically, in the first FET region 101, the threshold voltage metal 280 is on the high-k material 115, whereas in the second FET region 102, the remaining multi-layer stack portion 120A is between the high-k 115 and the threshold voltage metal 280. In a preferred embodiment, the threshold voltage metal may be titanium nitride. In a preferred embodiment, the thickness of the threshold voltage metal is from about 10 angstroms to about 100 angstroms and ranges therebetween.

Figure 8:
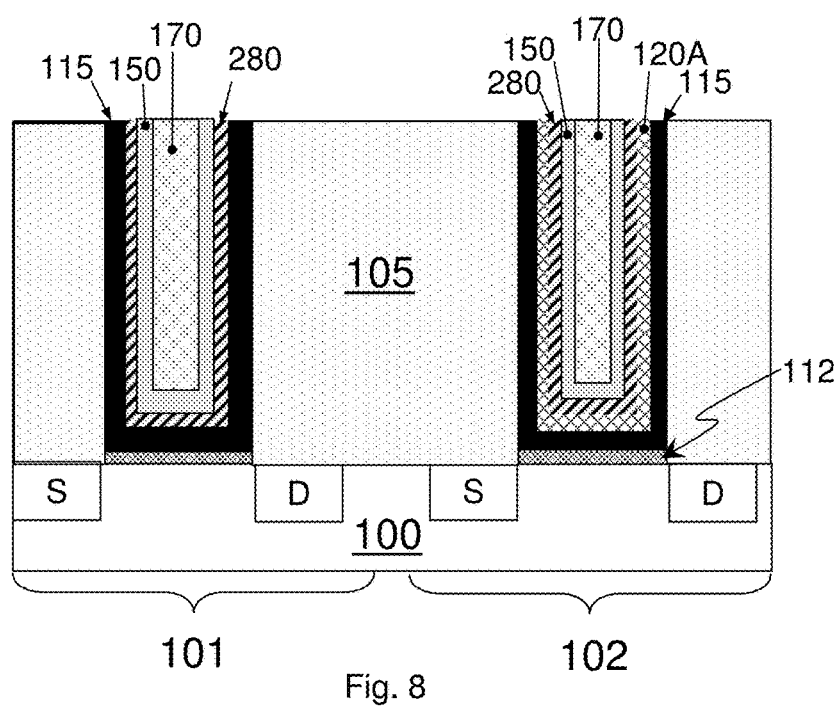
FIG. 8 is a sectional view illustrating a stage subsequent in which the same work function materials and fill materials are placed over both FET regions to form two FETs having different threshold voltages according to an embodiment of the present invention.

Referring to FIG. 8, a further stage of fabrication in which a first work function metal stack 150 suitable for setting a work function is formed over the threshold voltage metal 280 in both the first and second FET regions, 101 and 102 respectively. In the instant embodiment, the first and second FET regions 101 and 102 are the same type of FET, meaning they are both N-FETs or P-FETs. If the first and second FET regions are N-FETs, then the work function setting stack 150 may be one or more layers of titanium nitride and a layer containing two or more of the following elements: titanium, aluminum and carbon or other appropriate elements. In this embodiment, the same work function stack is placed and remains in both the first and second openings. There is no second work function material in the second opening. Thereafter, still referring to FIG. 8, further processing can be performed to complete the gates of the first and second FETs. Specifically, a fill stack 170 is formed in the openings and planarized. Fill stack 170 may include several layers including a metal seal layer, a wetting layer, and a seed layer and a bulk fill layer can be deposited. Not every layer is needed in all cases. In one embodiment, the wetting layer may be titanium nitride and the bulk fill layer can be tungsten.

Multi-Threshold by Doping Embodiment

Next, the description turns to another embodiment in which a first and second set of replacement metal gate FETs are made which have different threshold voltages based upon doping of the high-k. An illustrative flow chart of an embodiment shown in FIG. 9. The first four steps 10-40 are the substantially the same as those previously described in the prior embodiment of a method for making multi-threshold FETs by incorporating a thinned, remaining portion of the stack. The main difference in step 10 is that the substrate has two sets of FETs. Within each set FET is one N-FET and one P-FET. Another difference being in the present method step 25 is the thinning stack is the multi-layer rather than single layer stack. In addition, in step 40, in the present method embodiment, the stack is thinned to leave the bottom layer (120A) and the middle layer (120B). Or stated in another way, the thinning step 40 removes the top layer, 120C, of the multi-layered stack 120. After this point, the method steps of the two different embodiments differ substantially.

At step 42 a dopant stack 140 is formed over the substrate. In step 46, a second lithography step masks the first set of FETs while the second set are exposed to remove the doping layer and another part of the multi-layer stack from the second set. In step 47, the lithographic masking materials are removed from the first set of FETs. Thereafter, in step 55, an annealing stack is formed over both sets of FETs and anneal drives the dopant into the high-k of the first set of FETs. In step 62, all layers over the high-k of the first and second FETs are removed. In step 70, the work function metals are formed on the NFETs in both sets of FETs and then on the PFETs on both sets of FETs. Of course, the order may be reversed. Finally, the openings in the dielectric are filled with a final metal layer(s) to complete the replacement metal gates.

The method embodiment of FIG. 9 will now be described in more detail in conjunction with FIGS. 2-5 and 10-14.

FIGS. 2-5 correspond to steps 10-40 of the method and are the same as those previously described in the first embodiment except for the fact the step 25's stack is the multi-layer rather than single layer material. In addition, in step 40, in the present method embodiment, the stack is thinned to leave the bottom layer (120A) and the middle layer (120B).

Figure 10:
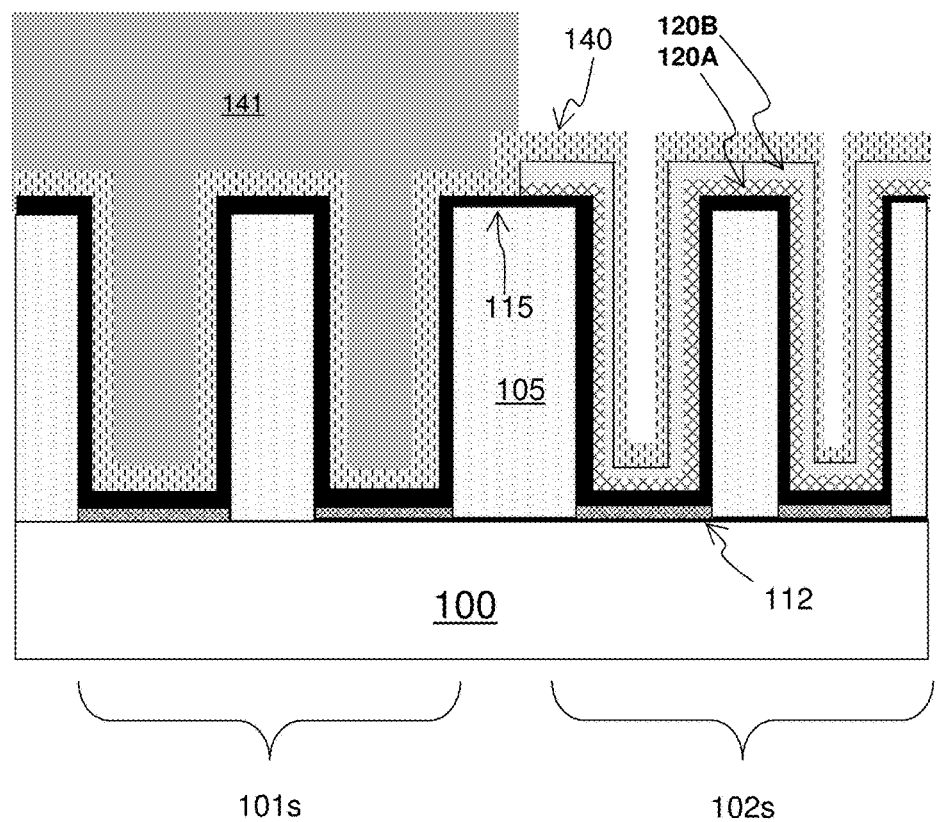
FIG. 10 is a sectional view illustrating a doping layer formation according to an embodiment.

In step 42, a doping stack 140 is formed over the substrate as depicted in FIG. 10. Due to the prior first lithography (step 30) and thinning (step 40), the doping 140 stack is directly over the high-k layer in the first set of FETs 101s and directly over the thinned remaining stack (first 120A and middle 120B) in the second set of FETs 102s. The dopant stack 140 may include a first layer in contact the surface of the preceding films, the first layer comprising a rare earth element such as Lanthanum or oxides or rare earth elements or alkaline earth metals (e.g. Sr), aluminum oxide, magnesium oxide and combinations thereof. In addition, the dopant stack may include a capping layer, such as TiN, on top of the first layer.

Figure 11:
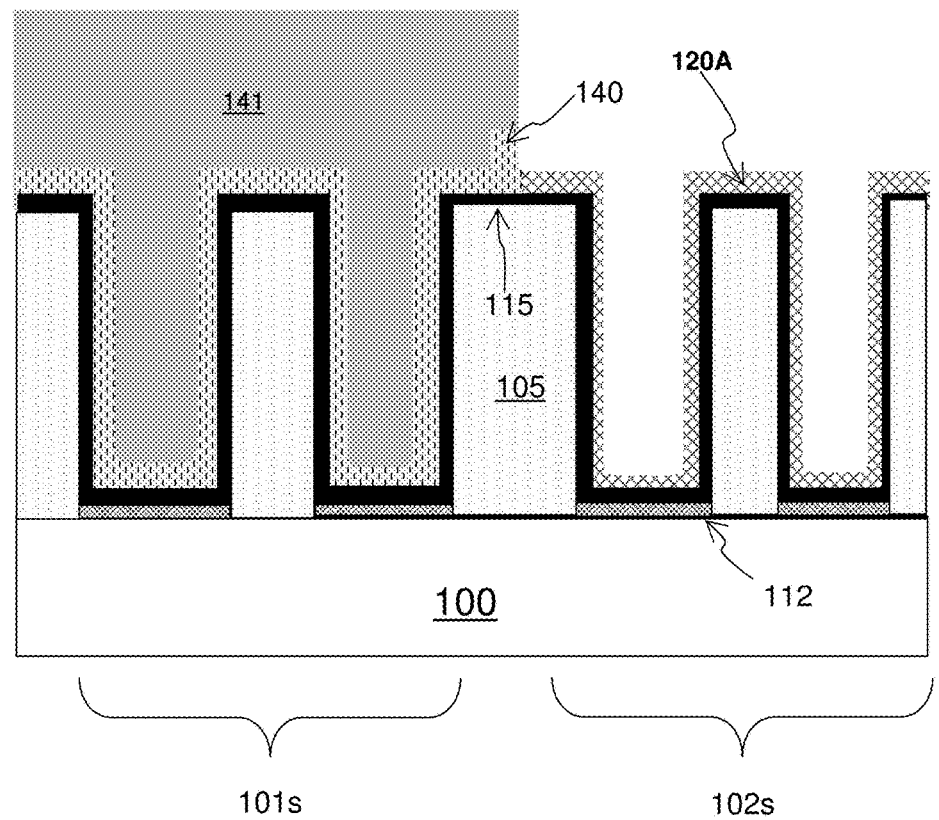
FIG. 11 is a sectional view illustrating an intermediate step according to an embodiment of the present invention.

Moving from FIG. 10 to FIG. 11, a mask material 141 is placed over the substrate and patterned to cover the first set of FETs 101s while exposing the region of the second set of FETs 102s. The mask material 141 may include an optical planarization layer (OPL) and a photoresist layer. Preferably, there is no hard mask in the mask material. Following the patterning of the mask material 141, and referring to FIG. 11, the doping stack 140 and middle portion 120B of the remaining multi-layer stack is removed from the region of the second set of FETs 102s. Thus, in FIG. 11, the second set of FETs 102s have high-k layer 115 and the bottom layer 120A (preferably TiN) of the remaining multi-layer stack whereas the first set of FETs 101s have high-k layer 115 and the doping stack 140 (preferably a rare earth material capped by TiN) and mask material 141.

Figure 12:
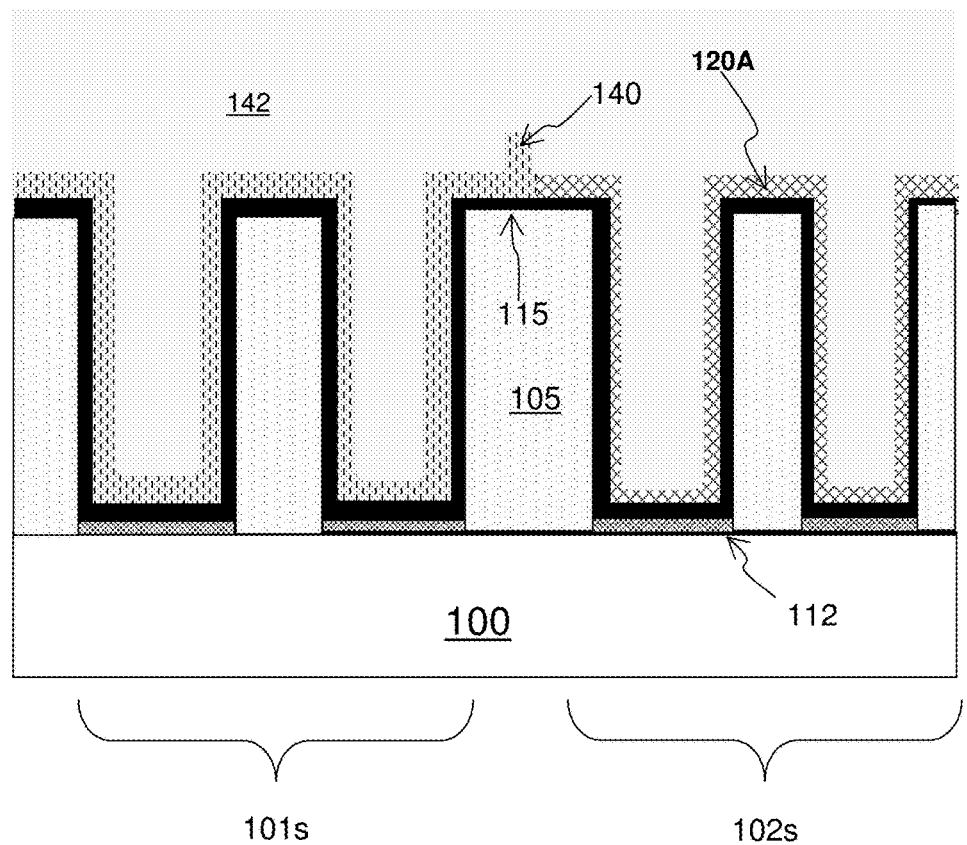
FIG. 12 is a sectional view illustrating a stage subsequent of forming an annealing stack according to an embodiment of the present invention.

Referring to FIG. 12, after removing the patterned mask material 141 from the first set of FETs 101s, an annealing layer 142 may be placed on top of the substrate. In the first set of FETs 101s, the annealing stack 142 is on the doping stack 140 (preferably a rare earth material capped by TiN) and in the second set of FETs 102s the annealing stack is on the remaining bottom layer (TiN, preferably) 120A. In a preferred embodiment, the annealing layer 142 may include an amorphous silicon layer. The amorphous silicon layer function to block oxygen from reaching the high-k during the anneal which would adversely impact Tinv (increase). The previously introduced titanium nitride layer of the doping stack 140 functions to prevent the silicon of the annealing stack 142 from forming a silicide with the underlying high-k layer 115 and/or dopant of the dopant stack.

Still referring to FIG. 12, with the dopant 140 and annealing 142 stacks in place, the substrate 100 is annealed to drive the dopant into the high-k 115 of the first set of FETs 101s. The anneal may be from about 800 C to about 1300 C and ranges therebetween. If the temperature is too low the dopants will not diffuse sufficiently into the high-k material 115 and there will be no shift in the threshold voltage of the first FET. If the temperature is too high, too much dopant moves close to the substrate 100 causing a change in crystallization of the high-k material which may lead to severe gate leakage. The anneal may be performed by a soak anneal (several seconds), spike/rapid thermal anneal (RTA) which is a few seconds, or a laser anneal (LSA) which is milliseconds. Typically, the anneal is performed in inert ambient such as nitrogen and/or argon.

Figure 13:
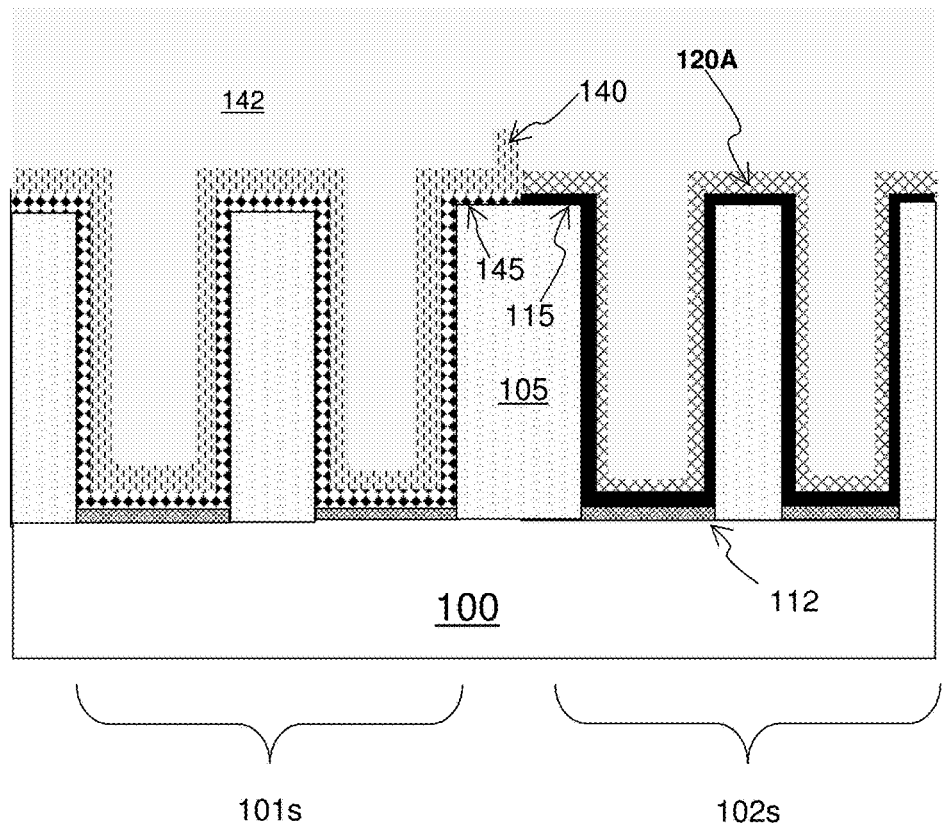
FIG. 13 is a sectional view illustrating the substrate after anneal to form a doped high-k layer in a region according to an embodiment of the present invention.

FIG. 13 shows the structure after anneal in which the high-k of the first set of FETs 101s has become doped high-k 145, while the high-k in the second set of FETs 102s remains undoped high-k 115.

Figure 14:
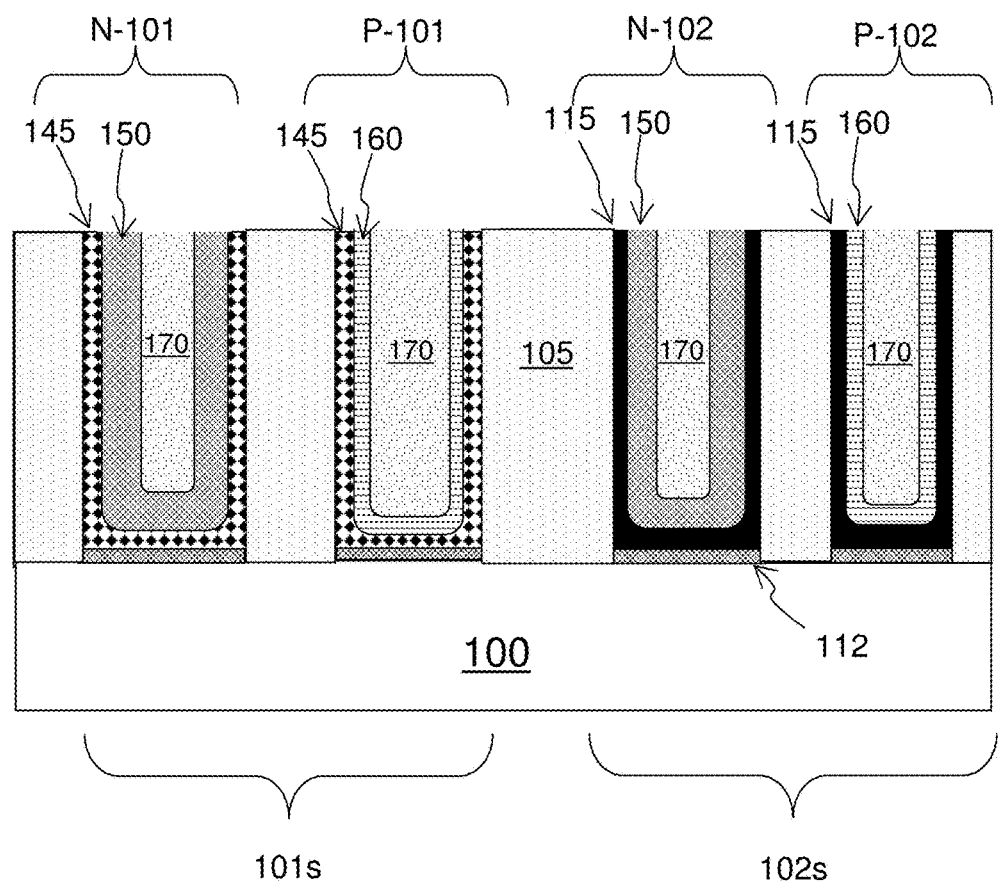
FIG. 14 is a sectional view illustrating a stage subsequent in which the multi-threshold NFETs and PFETs are formed by virtue of the high-k doping in the first and second set of FETs according to an embodiment of the present invention.

Turning to FIG. 14, annealing stack 142, dopant stack 140 and the remaining thinned blocking layer 120A are removed. Removal is by a sequence of wets processes, typically involving ammonia based chemistry to remove silicon, peroxide and HCl and ammonia based chemistries (SC1, SC2) to remove the TiN and the dopant materials. Choice of chemistry is motivated by efficiency in removing these materials while retaining high selectivity to the high-k materials (doped 145 and undoped 115). Furthermore, work function metals 150 and 160 and fill metal 170 have been form in the openings for the first and second set of FETs. Here, work function metals 150 may refer to NFET work function materials while work function metals 160 may refer to PFET work function materials. N work function metals 150 may be a multi-layered of materials which include at least one of a barrier layer, a work function layer and a capping layer. These layers may include TiN as barrier or cap materials, and work function layers may include one or more of the following elements: titanium, aluminum, nitrogen and carbon, for example. P work function metals 160 may include Titanium nitride, for example or other suitable materials.

Referring to FIG. 14, each of the sets of FETs has at least one N work function metals 150 and one P work function metals 160. Thus, the first set of FETs 101s which have the doped high-k 145 include at least one N-FET labeled as N-101 and one PFET labeled as P-101. Similarly, the second set of FETs 102 which have the undoped high-k 115 include at least one N-FET labeled as N-102 and one PFET labeled as P-102. All the N-FETs, regardless if in part of the first doped or second undoped set, share the same work function 150 and fill 170 materials. All the P-FETs, regardless if in part of the first doped or second undoped set, share the same work function 160 and fill 170 materials. Despite the fact that all the N-FETs have the same work function materials, the NFETs of the first 101 and second 102 sets have different threshold voltages due to the differences in high-k doping. Similarly, despite the fact that all the P-FETs have the same work function materials, the PFETs of the first 101 and second 102 sets have different threshold voltages ("Vt") due to the differences in high-k doping. Thus, multi-threshold NFETs and PFETs are formed by virtue of the high-k doping in the first and second set of FETs. In on example, the NFET in the first set of FETs, namely N-101 may be a low Vt NFET while the NFET in the second set of FETs, namely N-102 may be a high Vt NFET. The PFET in the first set of FETs, namely P-101 may be a high Vt NFET while the PFET in the second set of FETs, namely P-102 may be a low Vt NFET.

The immediately above described method of making a multi-threshold device by dual CMOS patterning and doping the high-k has the advantage of incorporating rare-earth dopants in some FETs of replacement metal gates which improves the device reliability, provides Tinv scaling and also provides multi Vt capability (i.e. NFETs with different threshold voltages and PFETs with different threshold voltages); the method achieves these advantages with minimal penalty to key device properties such as gate capacitance, threshold voltage, gate leakage etc. using a dual CMOS patterning process.

In contrast, other known methods have drawbacks. For example, to achieve this patterning, other known methods typically use a blocking or barrier layer consisting of a metal such as TiN is used to block the dopant from FETs that should not incorporate the dopant and is patterned off the FETs that are supposed to incorporate the dopant. Subsequent to this patterning, the dopant film is deposited followed by an annealed. During this anneal, the two FETs (one incorporating the rare-earth dopant and the other blocked against it) have an inherent asymmetry in terms of the film thickness. The thicker film in the blocked FET has dissolved oxygen inside it that causes the following undesirable side-effects (a) Incorporation of the oxygen dissolved in the metal films into the gate stack, thereby degrading the gate capacitance if the blocked FET (manifested as an increase in Tinv); (b) The thick film of TiN or such material in the blocked FETs leads to threshold voltage increase in these FETs; (c) In cutting edge RMG technology with narrow gates that are <20 nm in length, deposition such thick films that clog the gate trenches cause serious defectivity and yield issues.

As was seen in the above description of FIGS. 10-14, the method outlined in the current invention circumvents the key issue of thick barrier material by using a 2nd patterning step to selectively thin down the barrier stack on the blocked FETs, thereby providing a thin film under the sacrificial silicon that resolves problems all of the problems (a), (b) and (c) above.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of fabricating FETs of the same type having different threshold voltages by incorporating a thinned stack in a replacement metal gate process, the method comprising:
   (a) forming a first opening in a dielectric layer overlying a first FET region of a substrate and forming a second opening in a dielectric layer overlying a second FET region of the substrate;
   (b) forming a high-k layer lining both the first and second openings;
   (c) forming a thinning stack in the second opening of the second FET region, the thinning stack including a first bottom layer, a second middle layer, and third top layer, wherein the second middle layer has a composition different from the first bottom layer and the third top layer and the second middle layer is positioned between and in contact with the first bottom layer and the third top layer, and wherein the first bottom layer includes titanium nitride (TiN);
   (d) removing a portion of the thinning stack to leave a thinned remaining portion of the thinning stack in the second opening of the second FET region, including removing the third top layer such that the thinned remaining portion of the thinning stack in the second opening of the second FET region includes at least the first bottom layer;
   (e) forming a threshold voltage metal which is in contact with the high-k layer in the first opening and in contact with the thinned remaining portion of the thinning stack in the second opening;
   (f) forming a first work function metal stack in the first and second openings of the first FET and second FET regions; and
   (g) filling the first and second openings with a fill material,
   wherein the first and second FET regions have the same high-k layer, the same threshold voltage metal, the same work function metal stack and the same fill material but have different threshold voltages.

2. The method of claim 1 wherein the thinned remaining portion of the thinning stack includes titanium nitride having a thickness from about 15 to about 25 angstroms.

3. The method of claim 2 wherein the threshold voltage metal comprises titanium nitride having a thickness from about 10 to about 100 angstroms.

4. The method of claim 3 wherein the first and second FET regions include N-FETs.

5. The method of claim 1, wherein the second middle layer includes a lanthanum-containing (La-containing) material.

6. The method of claim 5 wherein removing of a portion of the thinning stack includes etching the third top layer with a first solution to which the La-containing material of the second middle layer is resistant when on the TiN.

7. The method of claim 6 wherein the third top layer includes TiN.

8. The method of claim 1 wherein (d) removing the portion of the thinning stack to leave the thinned remaining portion of the stack over the second FET region further comprises: exposing the thinning stack to a solution comprising about a 50:1.5 aqueous solution of ammonium hydroxide and hydrogen peroxide.

9. The method of claim 1 wherein (d) removing the portion of the thinning stack to leave the thinned remaining portion of the stack over the second FET region further comprises: removing the portion of the thinning stack at a removal rate of about 5-10 angstroms per minute.

10. The method of claim 1 wherein (c) forming the thinning stack over the second FET region further comprises: forming the thinning stack over the first and second FET regions of the substrate; forming a soft mask lithography stack including an optical planarization layer; exposing and developing the soft mask lithography stack; and patterning the optical planarization layer to remove the optical planarization over the first FET region while the thinning stack protects the high-k layer in the first opening.

11. The method of claim 1, wherein (d) removing the portion of the thinning stack to leave the thinned remaining portion of the stack over the second FET region further comprises:
   lithographically patterning the thinning stack so that it is removed from a first FET region but remains on a second FET region; and
   after the lithographic patterning, removing a portion of the stack in the second FET region to leave the thinned remaining portion of the stack over the second FET region.

12. The method of claim 1, wherein (d) removing the portion of the thinning stack to leave the thinned remaining portion of the stack over the second FET region further includes:
   (d) removing a portion of the thinning stack to leave a thinned remaining portion of the thinning stack on the sidewalls of the second FET region.

13. A method of fabricating FETs of the same type having different threshold voltages by incorporating a thinned stack in a replacement metal gate process, the method comprising:
   (a) forming a first opening in a dielectric layer overlying a first FET region of a substrate and forming a second opening in a dielectric layer overlying a second FET region of the substrate;
   (b) forming a high-k layer lining both the first and second openings;
   (c) forming a thinning stack in the second opening of the second FET region, the thinning stack including a first bottom layer, a second middle layer, and third top layer, wherein the second middle layer has a composition different from the first bottom layer and the third top layer and the second middle layer is positioned between and in contact with the first bottom layer and the third top layer, and wherein the first bottom layer includes titanium nitride (TiN);
   (d) removing a portion of the thinning stack at a removal rate of about 5-10 angstroms per minute to leave a thinned remaining portion of the thinning stack on the bottom and sidewalls of the second opening of the second FET region, including removing the third top layer such that the thinned remaining portion of the thinning stack in the second opening of the second FET region includes at least the first bottom layer, and wherein the thinned remaining portion of the thinning stack includes titanium nitride having a thickness from about 15 to about 25 angstroms;
   (e) forming a threshold voltage metal which is in contact with the high-k layer in the first opening and in contact with the thinned remaining portion of the thinning stack in the second opening;
   (f) forming a first work function metal stack in the first and second openings of the first FET and second FET regions; and
   (g) filling the first and second openings with a fill material,
   wherein the first and second FET regions have the same high-k layer, the same threshold voltage metal, the same work function metal stack and the same fill material but have different threshold voltages.

14. The method of claim 13, wherein the first and second FET regions include N-FETs.

15. The method of claim 13, wherein (d) removing the portion of the thinning stack to leave the thinned remaining portion of the stack over the second FET region further comprises: exposing the thinning stack to a solution comprising about a 50:1.5 aqueous solution of ammonium hydroxide and hydrogen peroxide.

16. The method of claim 13, wherein (c) forming the thinning stack over the second FET region further comprises: forming the thinning stack over the first and second FET regions of the substrate; forming a soft mask lithography stack including an optical planarization layer; exposing and developing the soft mask lithography stack; and patterning the optical planarization layer to remove the optical planarization over the first FET region while the thinning stack protects the high-k layer in the first opening.

17. The method of claim 13, wherein (d) removing the portion of the thinning stack to leave the thinned remaining portion of the stack over the second FET region further comprises:
   lithographically patterning the thinning stack so that it is removed from a first FET region but remains on a second FET region; and
   after the lithographic patterning, removing a portion of the stack in the second FET region to leave the thinned remaining portion of the stack over the second FET region.

18. The method of claim 13, wherein the second middle layer includes a lanthanum-containing (La-containing) material.

19. The method of claim 18 wherein removing of a portion of the thinning stack includes etching the third top layer with a first solution to which the La-containing material of the second middle layer is resistant when on the TiN.

20. The method of claim 19, wherein the third top layer includes TiN.

* * * * *